United States Patent
Cho

(10) Patent No.: US 11,631,442 B1
(45) Date of Patent: Apr. 18, 2023

(54) MULTI-CLOCK CYCLE MEMORY COMMAND PROTOCOL

(71) Applicant: MICRON TECHNOLOGY, INC., Boise, ID (US)

(72) Inventor: Kwang-Ho Cho, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/556,619

(22) Filed: Dec. 20, 2021

(51) Int. Cl.
*G11C 7/10* (2006.01)
*G11C 7/22* (2006.01)

(52) U.S. Cl.
CPC ............ *G11C 7/1039* (2013.01); *G11C 7/106* (2013.01); *G11C 7/1048* (2013.01); *G11C 7/1087* (2013.01); *G11C 7/222* (2013.01)

(58) Field of Classification Search
CPC ...... G11C 5/145; G11C 16/30; G11C 16/0483
USPC ............ 365/185.17, 185.18, 185.11, 230.06, 365/230.08
See application file for complete search history.

(56) References Cited

U.S. PATENT DOCUMENTS

| | | | |
|---|---|---|---|
| 9,865,324 B2 | 1/2018 | Matsuno et al. | |
| 2011/0164460 A1 | 7/2011 | Kajigaya et al. | |
| 2014/0181333 A1 | 6/2014 | Bains | |
| 2015/0098287 A1 | 4/2015 | Lee | |
| 2015/0317096 A1 | 11/2015 | Bains | |
| 2017/0110173 A1* | 4/2017 | Matsuno | G11C 7/1039 |
| 2019/0156871 A1* | 5/2019 | Howe | G11C 7/1057 |
| 2020/0194056 A1* | 6/2020 | Sakurai | G11C 11/40618 |

OTHER PUBLICATIONS

International Search Report and Written Opinion for PCT Application No. PCT/US2022/047038, dated Feb. 21, 2023, 9 Pages.

* cited by examiner

*Primary Examiner* — Connie C Yoha
(74) *Attorney, Agent, or Firm* — Fletcher Yoder, P.C.

(57) ABSTRACT

Systems and methods for providing memory access commands to memory circuitry using a multi-clock cycle memory command protocol is described. A command decoder (or controller) of the memory circuitry may efficiently receive a memory access request (or a memory command) provided using multiple clock cycles. For example, the command decoder may receive a header and a first portion of address bits of target memory cells of the memory command in a first clock cycle and a second portion of the address bits of the target memory cells in a subsequent clock cycle. Accordingly, the memory circuitry may receive a memory command provided over multiple clock cycles with one header. Such memory commands may efficiently include a high number of address bits received using input circuitry of the memory circuitry.

20 Claims, 6 Drawing Sheets

MULTI-CLOCK CYCLE MEMORY COMMAND PROTOCOL

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

The following relates generally to memory devices and more specifically to providing memory commands for accessing, sensing, and other operations for memory cells. The techniques and methods described herein may be used with ferroelectric memory devices or other type of memory devices. Memory devices are widely used to store information in various electronic devices such as computers, wireless communication devices, cameras, digital displays, and the like. Information is stored by programming different states of storage elements of a memory device. For example, binary devices have two states, often denoted by a logic "1" or a logic "0." in other systems, more than two states may be stored in each storage element. To access the stored information, the electronic device may read or sense the stored state in the storage element of the memory device. To store information, the electronic device may write or program the state in the storage element of the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. A non-volatile memory device, e.g., a flash memory, can store data for extended periods of time even in the absence of an external power source. A volatile memory device, e.g., a DRAM, may lose the stored state over time unless it is periodically refreshed by an external power source.

A memory device may include a number of storage elements, such as memory cells. Memory cells of a binary memory device may, for example, include a charged or discharged. capacitor. A charged capacitor of a memory cell may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous. Some of the memory devices include memory cells that may be accessed by turning on a transistor that couples the memory cell (e.g., the capacitor) with a wordline or a bitline/digit line.

That said, FeRAMs may use similar device architectures as a volatile memory but may have non-volatile properties due to the use of a ferroelectric capacitor as a storage element or memory cell. FeRAM devices may thus have improved performance compared to some other non-volatile and volatile memory devices. Some FeRAMs may split a sense window of a FeRAM memory cell to store 2 states per memory cell, whereas, other FeRAMs may split a sense window of a FeRAM memory cell to store multiple states (e.g., 3 or 4) per memory cell.

Moreover, different memory devices may use different architecture for arranging the memory cells. For example, different memory devices may arrange the memory cells in 2-dimensional or 3-dimensional rows and columns. A memory cell may be accessed based on activating a row and a column of the memory device corresponding to the memory cell.

BRIEF DESCRIPTION OF THE DRAWINGS

Various aspects of this disclosure may be better understood upon reading the following detailed description and upon reference to the drawings in which.

DETAILED DESCRIPTION

Figure 1:
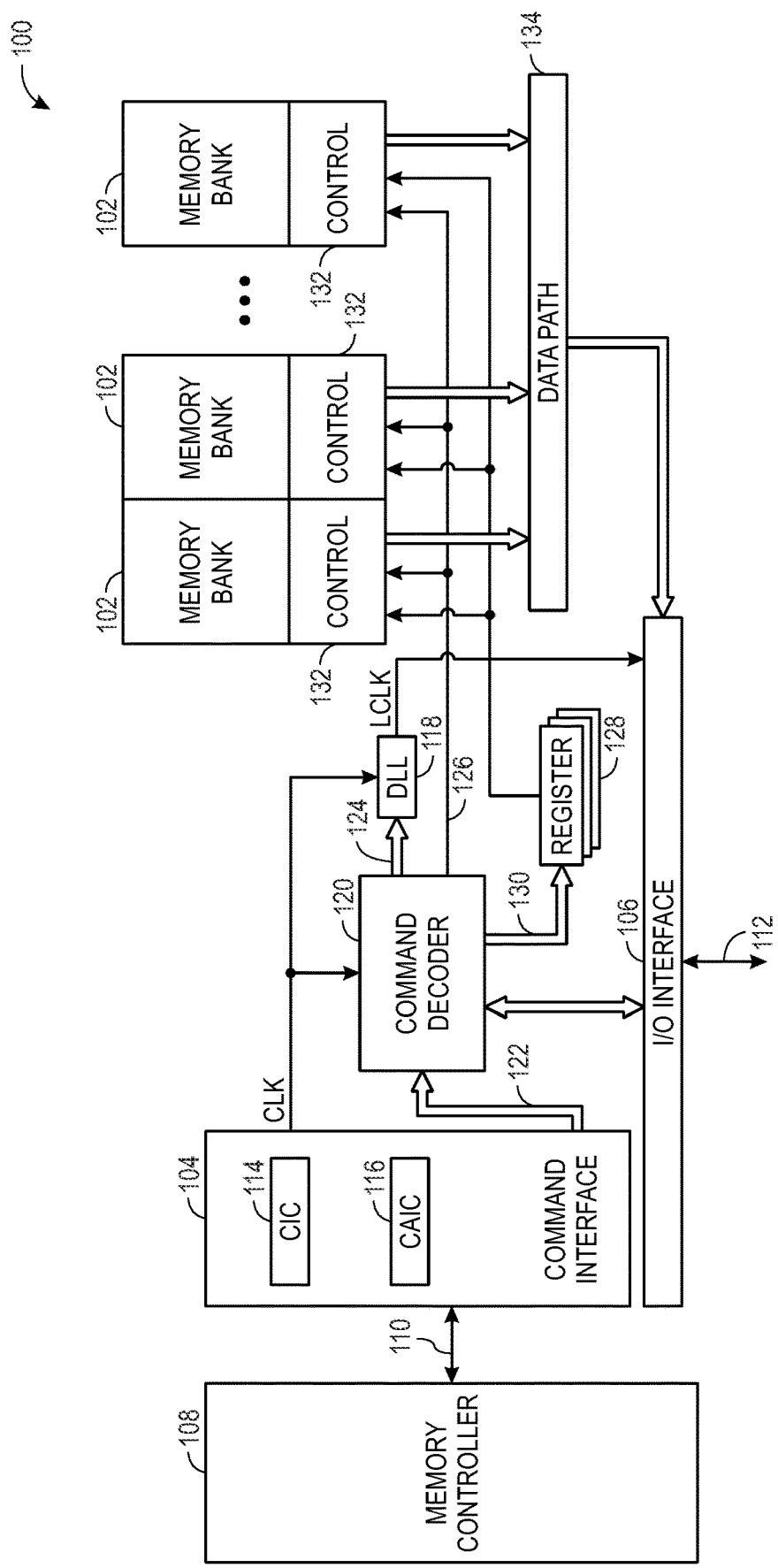
FIG. 1 is a block diagram illustrating certain features of a memory device, in accordance with an embodiment of the present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A memory device may perform memory operations such as storing data and retrieving stored data. For example, a computing system may include various system components including one or multiple memory devices. The system components may communicate data (e.g., data bits) to perform system operations. For example, the system may include one or more processing components, one or more memory devices, among other system components. In different embodiments, the computing system may be disposed on a single electronic chip or multiple electronic chips. Moreover, the computing system may be disposed on a single electronic device or multiple electronic devices positioned in proximity of or remote from each other.

In any case, the memory device may include multiple memory components for storing data and retrieving stored data based on receiving access commands (e.g., memory access requests) from various system components (e.g., a processor). For example, the processor may transmit the access commands using a number of data bits. In different embodiments, the processor may transmit the access commands using different communication protocols (e.g., memory command protocols). For example, the processor may use a memory command protocol based on a number of communication pins (hereinafter, pins) of the memory device. The memory device may receive a number of data bits corresponding to a number of pins of the memory device at each rising or falling edge of a clock signal.

The memory device may include a number of memory banks, controller circuitry, command decoder circuitry, and a clock circuit to provide the clock signal, among other memory components. In some cases, the controller circuitry (hereinafter, controller) may include the command decoder circuitry (hereinafter, command decoder). In alternative or additional cases, the command decoder may include separate circuitry disposed between the controller and the memory banks or any other viable location. Moreover, the memory components may include an input/output interface for communication with other system components. For example, the input/output interface of some memory components may include the pins for receiving the access commands from the processor.

In different embodiments, the memory device may include a different number of memory banks (e.g., 2 memory banks, 4 memory banks, 8 memory banks, etc.). Each memory bank may include a number of memory cells arranged in rows and columns. Moreover, in different cases, a memory bank may include a different number of rows and/or columns of the memory cells (e.g., 18 rows, 22 rows, etc.).

In any case, the command decoder may include circuitry to receive the access commands and provide the access instructions to the memory banks, as will be appreciated. The command decoder may facilitate accessing target memory cells by providing the access instructions. The access commands may include requests to perform memory operations including memory read operations and memory write operations on the target memory cells. In some cases, the processor of the computing system may transmit the access commands to the memory device. In different cases, any other viable processing circuitry may transmit the access commands to the memory device.

As mentioned above, the processor may transmit the access commands to the memory device using a memory command protocol. Moreover, the memory command protocol is determined, at least in part, based on a number of pins of the memory device. For example, at each rising or falling edge of the clock signal, the command decoder may receive a number of data bits of the access commands corresponding to the number of pins. Subsequently, the command decoder may provide the access instructions to activate respective rows and columns of the target memory cells for accessing (e.g., reading from and/or writing to) the target memory cells.

With the foregoing in mind, in different embodiments, the access commands may include a different length or include a different number of data bits. In some cases, each access command may include a header followed by a number of address bits associated with the target memory cells. For example, the header may indicate a read and/or write access instruction to the memory banks. Moreover, the address bits may include address information of the target memory cells indicating the rows, columns, and/or memory banks of the target memory cells.

Moreover, the memory device may access a set of target memory cells at one memory cycle. For example, the memory cycle may correspond to one or multiple clock cycles. Moreover, at each memory cycle, the memory device may receive a set of address bits indicative of the set of target memory cells. In different embodiments, the memory device may receive the set of address bits using one or multiple access commands, as will be appreciated.

The set of address bits may include a number of data bits corresponding to a number of rows, columns, and/or memory banks of the memory cells in the memory device. For example, at each memory cycle, each set of address bits may include one address bit per row of memory cells of the memory device for indicating the set of target memory cells.

With the foregoing in mind, in some cases, the set of the address bits may include a number of address bits higher than a threshold. The threshold number of address bits may be based on the number of pins of the memory device. Moreover, the number of the address bits of the set of address bits may correspond to a number of rows and/or columns of memory cells of the memory device.

In some embodiments, the processor may transmit multiple access commands, each including a header and a portion of the set of address bits, to indicate the address information of the target memory cells. Accordingly, each access command may include a portion of the set of address bits for accessing the target memory cells. That is, each memory cycle may correspond to multiple access commands, each including a respective command header and a portion of the set of address bits, may collectively provide the address information. In such embodiments, the memory device may receive each access command using a single clock cycle. For example, each clock cycle may correspond to a rising edge and/or a falling edge of the clock signal.

As mentioned above, the number of address bits may correspond to the number of rows, columns, and/or memory banks of the memory device. In some cases, each address bit may correspond to a respective row and/or memory bank of the memory device. Moreover, the number of pins of the memory device may correspond to a number of data bits the command decoder of the memory device may receive at each clock cycle. Accordingly, the memory device may receive a number of access commands using a single clock cycle to receive the set of address bits at each memory cycle.

In alternative or additional embodiments, the processor may transmit the access commands using a multi-clock cycle memory command protocol. In such embodiments, the processor may transmit an access command including the set of address bits using multiple clock cycles. For example, the processor may provide the header and a portion of the set of address bits in a first clock cycle. Moreover, the processor may provide a remaining portion of the set of address bits, at least, in a second clock cycle. In some cases, the access command may provide the remaining portion of the set of address bits using multiple clock cycles (e.g., second clock cycle, third clock cycle, fourth clock cycle, etc.).

In such embodiments, the processor may provide one header followed by a number of address bits using multiple clock cycles. Accordingly, the processor may provide additional address bits based on using one header with multiple clock cycles. As such, the memory device may receive each access command over multiple clock cycles. Moreover, each access command may include the set of address bits and correspond to one memory cycle.

The command decoder of the memory device may receive the access commands using the multi-clock cycle memory command protocol. The command decoder may include circuitry to decode each access command provided using the multi-clock cycle memory command protocol. Accordingly, the command decoder may provide the access instructions to the memory banks based on receiving and decoding each access command provided using the multi-clock cycle memory command protocol.

Accordingly, the memory device may efficiently access the set of target memory cells in memory banks based on receiving one header with multiple clock cycles. As discussed above, the number of pins of the memory banks may correspond to a number of data bits the memory banks may receive in each clock cycle. Accordingly, the memory device may use a smaller number of pins based on efficiently receiving and decoding the address bits with less overhead (e.g., one header per multiple clock cycles).

In one non-limiting example, a memory device may include 7 pins for communicating data bits. Moreover, the memory banks of the memory device may include 22 rows. Furthermore, the memory device may include 8 memory banks disposed in 2 memory groups. For example, each memory group may include 4 memory banks. In such example, the access instructions may include 22 address bits corresponding to the 22 rows of the data banks and 4 address bits to identify the corresponding memory banks. Accordingly, the command decoder may receive the access commands with 26 address bits to identify the target memory cells. Moreover, the access commands may include a header with 2 data bits to indicate the memory read and/or write request to the memory device based on using the multi-clock cycle memory command protocol.

When using the multi-clock cycle memory command protocol, the command decoder may receive each access command using the 28 data bits over multiple clock cycles. As mentioned above, the 28 data bits may include the 26 address bits and 2 header data bits. In some cases, at each clock cycle, the memory banks may receive the data bits of the access instructions at a rising edge and a subsequent falling edge of a clock signal at each clock cycle. Accordingly, the memory banks may receive the 28 data bits of each access instruction over 2 clock cycles (each clock cycle including a rising edge and a falling edge) using the 7 pins when using the multi-clock cycle memory command protocol.

Moreover, the command decoder may include circuitry to decode the access commands. Accordingly, the command decoder may use the circuitry to provide the access instructions to the memory banks based on receiving and decoding the access commands provided using the multi-clock cycle memory command protocol. As such, the command decoder may facilitate efficiently accessing the set of target memory cells based on using the circuitry to decode the access commands provided using the multi-clock cycle memory command protocol.

Turning now to the figures, FIG. 1 depicts a simplified block diagram illustrating certain features of a memory device 100 (e.g., a memory subsystem of an apparatus). Specifically, the block diagram of FIG. 1 depicts a functional block diagram illustrating certain functionality of the memory device 100. In accordance with one embodiment, the memory device 100 may include a random access memory (RAM) device, a ferroelectric RAM (FeRAM) device, a dynamic RAM (DRAM) device, a static RAM (SRAM) device (including a double data rate SRAM device), flash memory, and/or a 3D memory array including phase change (PC) memory and/or other chalcogenide-based memory, such as self-selecting memories (SSM). Moreover, each memory cell of such 3D memory array may include a corresponding logic storing device (e.g., a capacitor, a resistor, or the resistance of the chalcogenide material(s)).

The memory device 100 may include a number of memory banks 102 each inclusive of one or more memory arrays. Various configurations, organizations, and sizes of the memory banks 102 on the memory device 100 may be used based on an application and/or design of the memory device 100 within an electrical system. For example, in different embodiments, the memory banks 102 may include a different number of rows and/or columns of memory cells. Moreover, the memory banks 102 may each include a number of pins for communicating with other blocks of the memory device 100. For example, each memory bank 102 may receive one data bit per pin at each clock cycle. Furthermore, the memory banks 102 may be grouped into multiple memory groups (e.g., two memory groups, three memory groups).

The memory device 100 may also include a command interface 104 and an input/output (I/O) interface 106. The command interface 104 is configured to provide a number of signals received from a processor (e.g., a processor subsystem of an apparatus) or a controller, such as a memory controller 108. In different embodiments, the memory controller 108, hereinafter controller 108, may include one or more processors (e.g., memory processors), one or more programmable logic fabrics, or any other suitable processing components.

In some embodiments, a bus 110 may provide a signal path or a group of signal paths to allow bidirectional communication between the controller 108, the command interface 104 and the I/O interface 106. For example, the controller 108 may receive memory access requests from the I/O interface via the command interface 104 and the bus 110. Moreover, the controller 108 may provide the access commands and/or access instructions for performing memory operations to the command interface 104 via the bus 110.

Similarly, an external bus 112 may provide another signal path or group of signal paths to allow for bidirectional transmission of signals, such as data signals and access commands (e.g., read/write requests), between the I/O interface 106, the controller 108, a command decoder 120, and/or other components. Thus, the controller 108 may provide various signals (e.g., the access commands, the access instructions, or other signals) to different components of the memory device 100 to facilitate the transmission and receipt of data to be written to or read from the memory banks 102.

That said, the command interface 104 may receive different signals from the controller 108. For example, a reset command may be used to reset the command interface 104, status registers, state machines and the like, during power-up. Various testing signals may also be provided to the memory device 100. For example, the controller 108 may use such testing signals to test connectivity of different components of the memory device 100. In some embodiments, the command interface 104 may also provide an alert signal to the controller 108 upon detection of an error in the memory device 100. Moreover, the I/O interface 106 may additionally or alternatively be used for providing such alert signals, for example, to other system components electrically connected to the memory device 100.

The command interface 104 may also receive one or more clock signals from an external device (e.g., an external clock signal). Moreover, the command interface 104 may include a clock input circuit 114 (CIC) and a command address input circuit 116 (CAIC). The command interface 104 may use the clock input circuit 114 and the command address input circuit 116 to receive the input signals, including the access commands, to facilitate communication with the memory banks 102 and other components of the memory device 100.

Moreover, the clock input circuit 114 may receive the one or more clock signals (e.g., the external clock signal) and may generate an internal clock signal (CLK) therefrom. In some embodiments, the command interface 104 may provide the CLK to the command decoder 120 and an internal clock generator, such as a delay locked loop (DLL) 118 circuit. The DLL 118 may generate a phase controlled internal clock signal (LCLK) based on the received CLK. For example, the DLL 118 may provide the LCLK to the I/O interface 106. Subsequently, the I/O interface 106 may use the received LCLK as a clock signal for transmitting the read data using the external bus 112.

The command interface 104 may also provide the internal clock signal CLK to various other memory components. As mentioned above, the command decoder 120 may receive the internal clock signal CLK. In some cases, the command decoder 120 may also receive the access commands via a bus 122 and/or through the I/O interface 106 received via the external bus 112. For example, the command decoder 120 may receive the access commands through the I/O interface 106 transmitted by one or more external devices. In some cases, a processor may transmit the access commands.

The command decoder 120 may decode the access commands and/or the memory access requests to provide corresponding access instructions for accessing target memory cells. For instance, the command decoder 120 may provide the access instructions to one or more control blocks 132 associated with the memory banks 102 via a bus path 126. In some cases, the command decoder 120 may provide the access instructions to the control blocks 132 in coordination with the DLL 118 over a bus 124. For example, the command decoder 120 may coordinate generation of the access instructions in-line (e.g., synchronized) with the CLK and/or LCLK.

Accordingly, the command decoder 120 may decode the access commands (e.g., memory access requests) to provide the access instructions. In some cases, the command decoder 120 may receive the access commands using a rising edge and/or a falling edge of the external clock signal. For example, a processor may transmit the access commands using a memory command protocol such as the multi-clock cycle memory command protocol. Moreover, the processor may use a specific memory command protocol based at least in part on the number of pins of the memory device 100 or the I/O interface 106, the number of rows and/or columns of the memory banks 102, and the number of memory banks 102. Subsequently, the command decoder 120 may provide the access instructions to the memory banks 102 based on receiving and decoding the access commands.

Accordingly, the command decoder 120 may provide the access instructions to the memory banks 102 using one or multiple clock cycles of the CLK via the bus path 126. The command decoder 120 may also transmit various signals to one or more registers 128 via, for example, one or more global wiring lines 130. Moreover, the memory device 100 may include other decoders, such as row decoders and column decoders, to facilitate access to the memory banks 102, as discussed below.

In some embodiments, each memory bank 102 may include a respective control block 132. In some cases, each of the control blocks 132 may also provide row decoding and column decoding capability based on receiving the access instructions. Accordingly, the control block 132 may facilitate accessing the memory cells of the respective memory banks 102. For example, the control blocks 132 may include circuitry (e.g., logic circuitry) to facilitate accessing the memory cells of the respective memory banks 102 based on receiving the access instructions.

In some cases, the control blocks 132 may receive the access instructions and determine target memory banks 102 associated with the target memory cells. In specific cases, the command decoder 120 may include the control blocks 132. Moreover, the control blocks 132 may also provide timing control and data control functions to facilitate execution of different commands with respect to the respective memory banks 102.

Furthermore, the command decoder 120 may provide register commands to the one or more registers 128 to facilitate operations of one or more of the memory banks 102, the control blocks 132, and the like. For example, one of the one or more registers 128 may provide instructions to configure various modes of programmable operations and/or configurations of the memory device 100. The one or more registers 128 may be included in various semiconductor devices to provide and/or define operations of various components of the memory device 100.

In some embodiments, the one or more registers 128 may provide configuration information to define operations of the memory device 100. For example, the one or more registers 128 may include operation instructions for DRAMs, synchronous DRAMs, FeRAMs, chalcogenide memories (e.g., SSM memory, PC memory), or other types of memories. As discussed above, the one or more registers 128 may receive various signals from the command decoder 120, or other components, via the one or more global wiring lines 130.

In some embodiments, the one or more global wiring lines 130 may include a common data path, a common address path, a common write command path, and a common read command path. The one or more global wiring lines 130 may traverse across the memory device 100, such that each of the one or more registers 128 may couple to the global wiring lines 130. The additional registers may involve additional wiring across the semiconductor device (e.g., die), such that the registers are communicatively coupled to the corresponding memory components.

The I/O interface 106 may include a number of pins (e.g., 7 pins) to facilitate data communication with external components (e.g., the processing component, such as a processor). Particularly, the I/O interface 106 may receive the access commands via the pins. Moreover, data stored on the memory cells of the memory banks 102 may be transmitted to and/or retrieved from the memory banks 102 over the data path 134. The data path 134 may include a plurality of bi-directional data buses to one or more external devices via the I/O interface 106. For certain memory devices, such as a DDR5 SDRAM memory device, the I/O signals may be divided into upper and lower bytes; however, such segmentation is not utilized in conjunction with other memory device types.

That said, in different embodiments, the memory device 100 may include additional or alternative components. That is, the memory device 100 may include additional or alternative components such as power supply circuits (for receiving external VDD and VSS signals), read/write amplifiers (to amplify signals during read/write operations), temperature sensors (for sensing temperatures of the memory device 100), etc. Accordingly, it should be understood that the block diagram of FIG. 1 is only provided to highlight certain functional features of the memory device 100 to aid in the subsequent detailed description.

Figure 2:
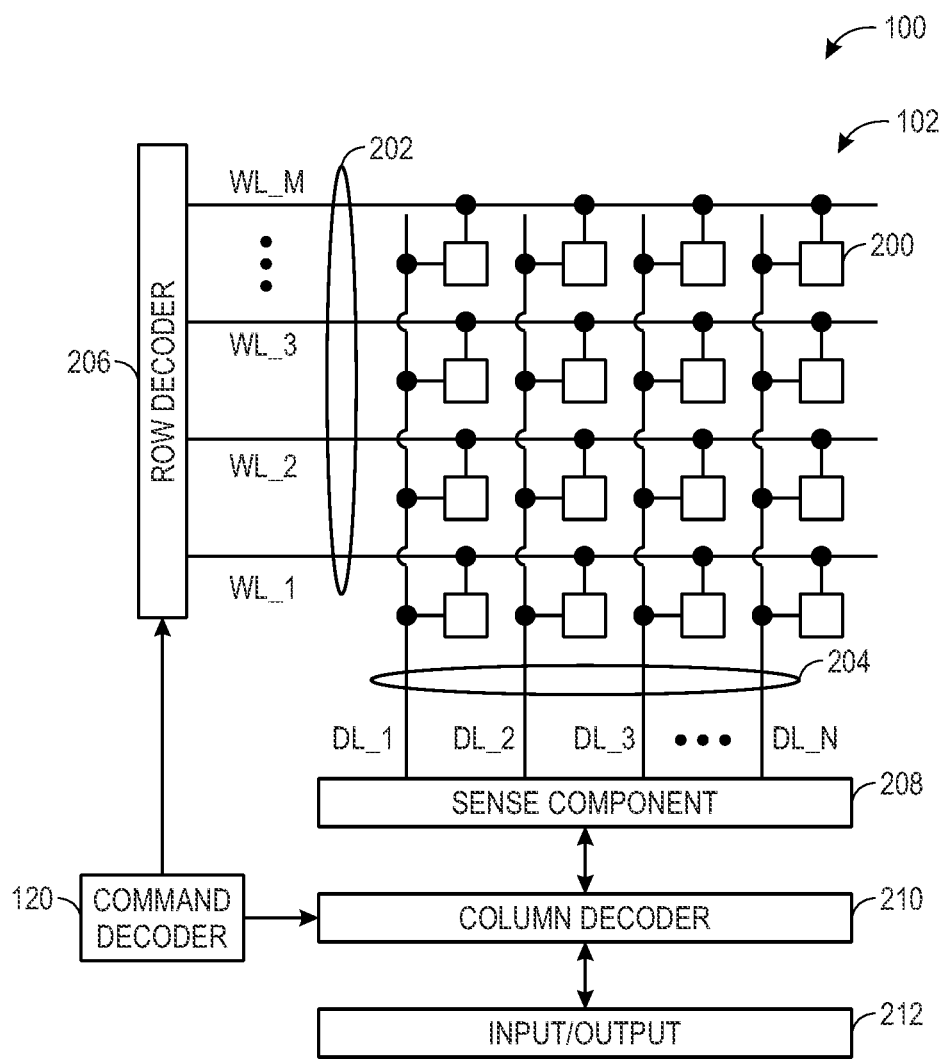
FIG. 2 is a memory bank of the memory device of FIG. 1, in accordance with an embodiment of the present disclosure.

Referring now to FIG. 2, a memory bank 102 of the memory device 100 is illustrated in accordance with various examples of the present disclosure. The memory bank 102 may include a number of memory cells 200 that are programmable to store different memory states. In the depicted embodiment, the memory cells 200 may be arranged in multiple rows (e.g., 22 rows, 19 rows, etc.) and multiple columns.

Memory operations, such as reading and writing memory states, may be performed on the memory cells 200 by activating or selecting the appropriate word lines 202 and digit lines 204. Activating or selecting a word line 202 or a digit line 204 may include applying a voltage to the respective lines. The word lines 202 and the digit lines 204 may include conductive materials.

For example, word lines 202 and digit lines 204 may be made of metals (such as copper, aluminum, gold, tungsten, etc.), metal alloys, other conductive materials, or the like. In the depicted embodiment, each row of the memory cells 200 is connected to a single word line 202, and each column of the memory cells 200 is connected to a single digit line 204. Moreover, each of the memory cells 200 may be associated with a row and a column of the memory bank 102. Accordingly, each of the memory cells 200 is connected to a respective word line 202 and a respective digit line 204.

By applying a voltage to a single word line 202 and a single digit line 204, a single memory cell 200 may be activated (or accessed) at their intersection. Accessing the memory cell 200 may include performing reading or writing operation on the memory cell 200. For example, a read operation may include sensing a charge level from the memory cell 200. The intersection of a word line 202 and digit line 204 may be referred to as an address of a respective memory cell 200. Accordingly, the command decoder 120 may provide the access instructions, including the address bits, to indicate the word lines 202 and digit lines 204 corresponding to the target memory cells 200.

In some architectures, the memory state storage of the memory cell 200 (e.g., a capacitor) may be electrically isolated from the digit line by a selection component. The word line 202 may be connected to and may control the selection component. For example, the selection component may be a transistor and the word line 202 may be connected to the gate of the transistor. Activating the word line 202 may result in an electrical connection or closed circuit between the capacitor of the memory cell 200 and its corresponding digit line 204. The digit line 204 may then be activated to either read or write the memory cell 200.

Accordingly, accessing the memory cell 200 may be controlled through a respective row decoder 206 and a respective column decoder 210. As mentioned above, in different embodiments, the controller 108, the command decoder 120, and/or the control blocks 132 may include the row decoder 206 and/or the column decoder 210. In some examples, the row decoder 206 may receive a row address from the command decoder 120 and may activate the appropriate word line 202 based on the received row address.

Similarly, a column decoder 210 may receive a column address from the command decoder 120 and may activate the appropriate digit line 204. The command decoder 120 may provide the row address and the column address based on receiving and decoding the access commands and providing the access instructions. For example, the memory bank 102 may include multiple, word lines 202, labeled WL_1 through WL_M, and multiple digit lines 204, labeled DL_1 through DL_N, where M and N depend on the array size. Thus, by activating a word line 202 and a digit line 204, e.g., WL_2 and DL_3, the memory cell 200 at their intersection may be accessed.

In any case, upon accessing, the memory cell 200 may be read, or sensed, by sense component. 208 to determine the stored state of the memory cell 200. For example, after accessing the memory cell 200, a ferroelectric capacitor of the memory cell 200 may discharge a first charge (e.g., a dielectric charge) onto its corresponding digit line 204. In other examples, after accessing the memory cell 200, the ferroelectric capacitor of the memory cell 200 may discharge a second or third charge (e.g., a polarization charge) onto its corresponding digit line 204. Discharging the ferroelectric capacitor may be based on biasing, or applying a voltage, to the ferroelectric capacitor.

The discharging may induce a change in the voltage of the digit line 204, which sense component 208 may compare to a reference voltage (not shown) in order to determine the stored state of the memory cell 200. For example, if the digit line 204 has a higher voltage than the reference voltage, then sense component 208 may determine that the stored state in the memory cell 200 is related to a first predefined memory state. In some cases, the first memory state may include a state 1, or may be another value—including other logic values associated with multi-level sensing that enables storing more than two values (e.g., 3 states per cell or 1.5 bits per cell). The sense component 208 may include various transistors or amplifiers in order to detect and amplify a difference in the signals, which may be referred to as latching. The detected logic state of the memory cell 200 may then be output through column decoder 210 as output 212.

In some examples, detecting and amplifying a difference in the signals, may include latching a charge that is sensed in sense component 208. One example of this charge may include latching a dielectric charge associated with the memory cell 200. As an example, the sense component 208 may sense a dielectric charge associated with the memory cell 200. The sensed dielectric charge may be latched in a latch within the sense component 208 or a separate latch that is in electronic communication with the sense component 208.

Figure 3A:
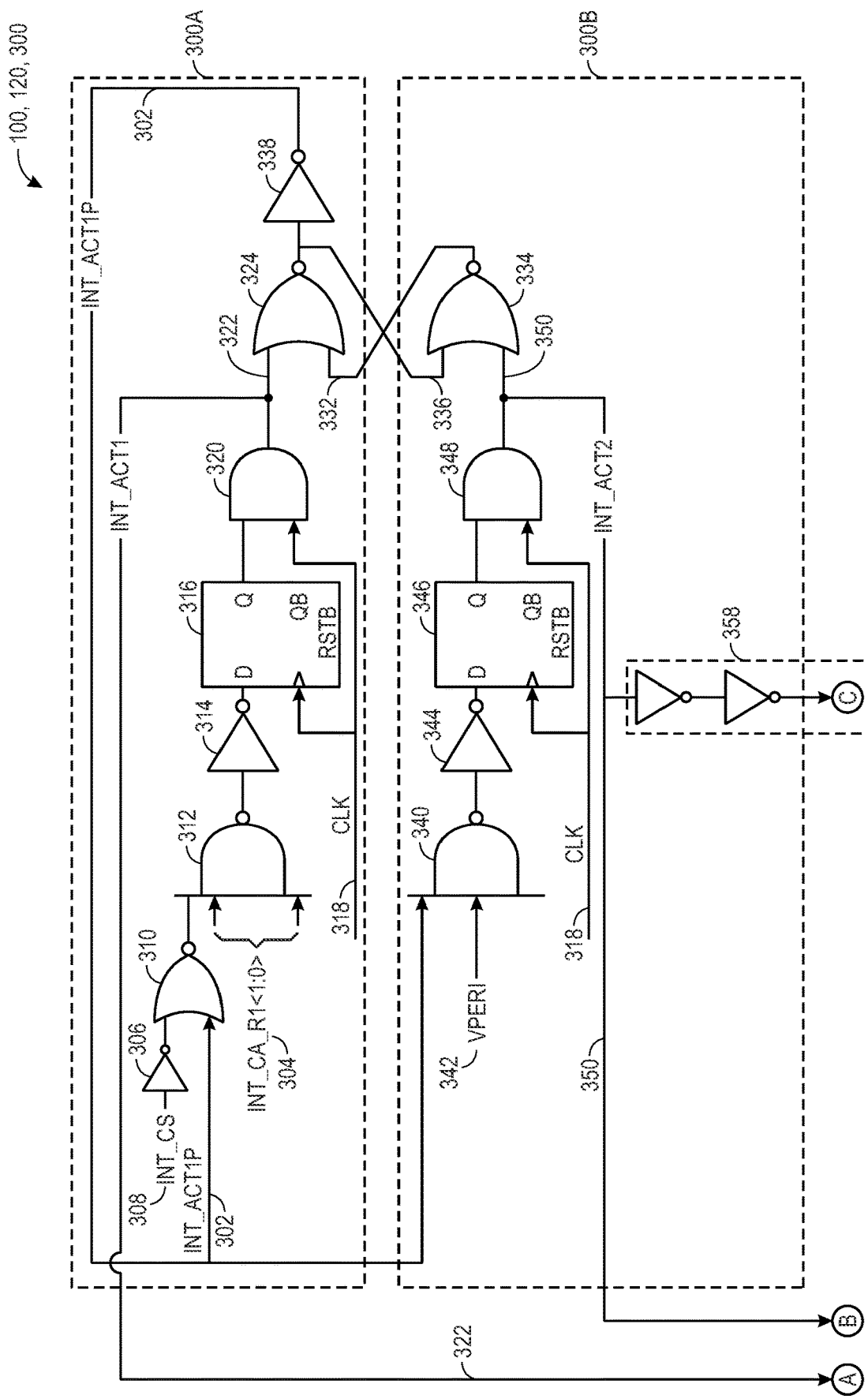
FIG. 3A is a first part of a schematic of a circuit associated with at least a portion of the command decoder of the memory device of FIGS. 1 and 2, in accordance with an embodiment of the present disclosure.
Figure 3B:
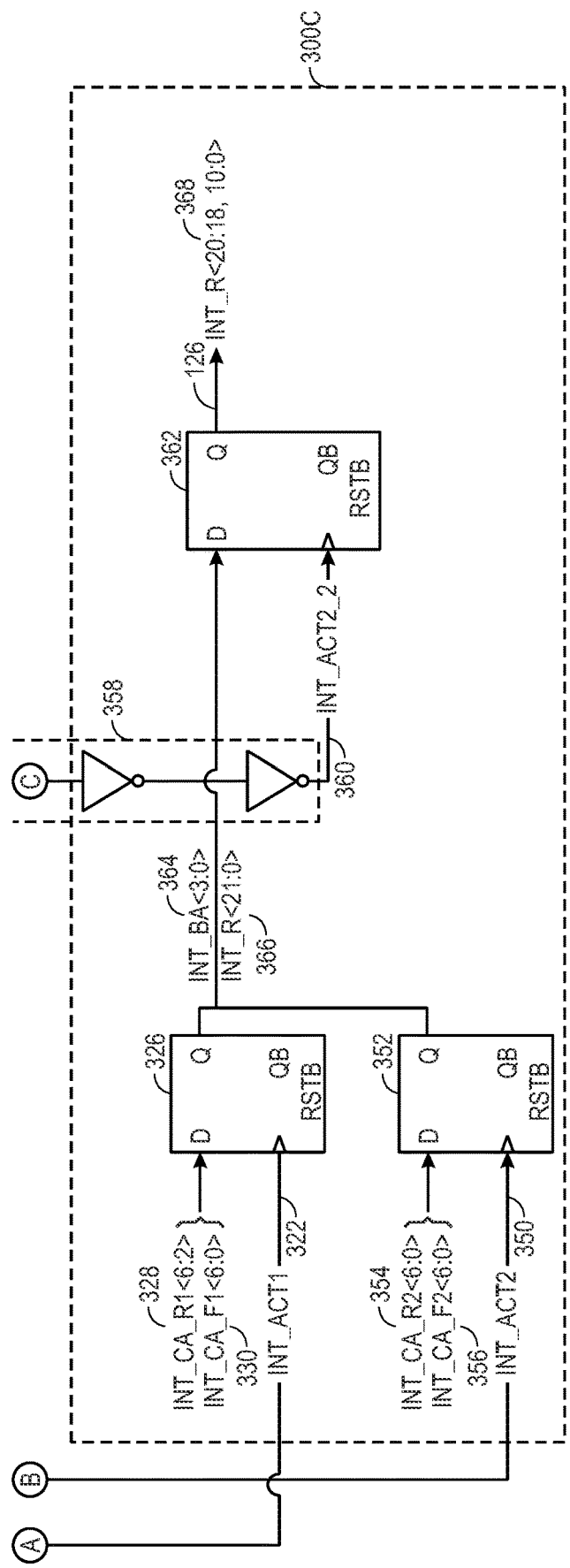
FIG. 3B is a second part of the schematic of the circuit associated with at least a portion of the command decoder of the memory device of FIGS. 1 and 2, in accordance with an embodiment of the present disclosure.

With the foregoing in mind, FIGS. 3A and 3B depict a schematic of a circuit associated with at least a portion of the command decoder 120. In particular, FIG. 3A depicts a first part and FIG. 3B depicts a second part of the schematic of the circuit associated with at least a portion of the command decoder 120. The command decoder 120 may include the circuit 300 for receiving and decoding the access commands transmitted using the multi-clock cycle memory command protocol. In some cases, the circuit 300 may also receive and decode the access commands transmitted using other memory command protocols (e.g., a single-clock cycle memory command protocol). Subsequently, the circuit 300 may provide the access instructions to the downstream memory components.

The circuit 300 may include a first portion of the circuit 300A, a second portion of the circuit 300B, and a third portion of the circuit 300C. The first portion of the circuit 300A and the second portion of the circuit 300B may provide an activation signal 302 (INT_ACT_1P) based on receiving a header 304 (INT_CA_R1<1:0>). For example, the first portion of the circuit 300A and the second portion of the circuit 300B may generate and use the activation signal 302 when the command decoder 120 is receiving an access command using the multi-clock cycle memory command protocol. The third portion of the circuit 300C may receive and provide the address bits of the access command to the downstream memory components based on operations of the first portion of the circuit 300A and the second portion of the circuit 300B, as will be appreciated. In some cases, the downstream memory components may include the control blocks 132 of FIG. 1, the memory banks 102 of FIG. 1, and/or the row decoder 206 and the column decoder 210 of FIG. 2.

When using the multi-clock cycle memory command protocol, the memory device 100 may receive the access command using multiple edges of the external clock signal. As mentioned above, each clock cycle of the external clock signal may include a rising edge and a falling edge of the external clock signal. Moreover, in some cases, each memory cycle for performing memory operations may correspond to one or multiple clock cycles of the external clock signal. Accordingly, in specific cases, the circuit 300 of the command decoder 120 may receive the access command using the external clock signal and provide the access instructions for performing the memory operations, in one memory cycle, based on using an internal clock signal (e.g., CLK) of the memory device 100.

With the foregoing in mind, an inverter 306 of the circuit 300 may receive a high (or logic 1) chip select signal 308 (INT_CS) associated with the first edge of the external clock signal. For example, the chip select signal 308 may indicate receiving a first access command provided using the multi-clock cycle memory command protocol. The inverter 306 may provide an inverted chip select signal with a logic 0 value to a NOR gate 310. Based on receiving the chip select signal 308, the NOR gate 310 may output a logic 1 value to a NAND gate 312.

The NAND gate 312 may also receive the header 304 provided with the first edge of the external clock signal using the multi-clock cycle memory command protocol. For example, the header 304 may include two logic 1 values or high data bits. An embodiment of the header 304 is also discussed below with respect to FIG. 5. In any case, the NAND gate 312 may provide a logic 0 value to an inverter 314 based on receiving high signals (or logic 1 values) from the header 304 and the NOR gate 310. The inverter 314 may in turn provide a logic 1 value to a latching circuit 316 (e.g., a flip-flop).

The latching circuit 316 may also receive the internal memory clock signal 318. In the depicted embodiment, the internal memory clock signal 318 may correspond to the CLK discussed above with respect to FIG. 1. The internal memory clock signal 318 may switch between logic 0 and logic 1 values according to a clock frequency. In any case, the latching circuit 316 may provide a logic 1 value in response to receiving the logic 1 value from the inverter 314 and receiving the internal memory clock signal 318 (e.g., a rising edge of the internal memory clock signal 318).

The latching circuit 316 may provide the logic 1 value to an AND gate 320. The AND gate 320 may also receive the internal memory clock signal 318. Accordingly, the AND gate 320 may provide a high (or logic 1 value) first internal signal 322 (INT_ACT1) based on receiving the logic 1 value of the latching circuit 316 and the internal memory clock signal 318 (e.g., a rising edge of the internal clock signal 318). The AND gate 320 may provide the first internal signal 322 with the logic 1 value to a first input of a NOR gate 324 and to a latching circuit 326 of the third portions of the circuit 300C.

The latching circuit 326 of the third portion of the circuit 300C may receive a first portion of the address bits 328 (INT_CA_R1<6:2>) and a second portion of the address bits 330 (INT_CA_F1<6:0>) based on receiving the first internal signal 322 with the logic 1 value. In some cases, the first portion of the address bits 328 may include address bits of the access command received with the first edge of the external clock signal. For example, when the memory device 100 uses 7 pins for receiving the data bits, the memory device 100 may receive the header 304 and the first portion of the address bits 328.

For example, the header 304 may include 2 data bits and the first portion of the address bits 328 may include 5 data bits. Moreover, the second portion of the address bits 330 may include address bits of the access command received with a second edge (e.g., subsequent clock edge) of the external clock signal. For example, the second portion of the address bits 330 may include 7 data bits received via the 7 pins of the memory device 100. Accordingly, in one example, the latching circuit may receive 12 address bits of the access command with the first and the second edges of the external clock signal.

The NOR gate 324 of the first portion of the circuit 300A may provide a first signal 332 to a NOR gate 334 of the second portion of the circuit 300B. The NOR gate 324 may provide the first signal 332 based on receiving the first internal signal 322 having a logic 1 value and the internal memory clock signal 318. As such, the NOR gate 324 may provide a logic 0 value as the first signal 332 to a first input of the NOR gate 334. A second input of the NOR gate 334 may remain low or receive a logic 0 value. Accordingly, the NOR gate 334 may in turn provide a second signal 336 based on receiving the first signal 332 at the first input and the logic 0 value at the second input. Accordingly, the NOR gate 334 may provide (or return) a logic 1 value as the second signal 336 to the second input of the NOR gate 324.

Subsequently, the NOR gate 324 may provide a logic 0 value based on receiving the logic 1 value of the second signal 336. The NOR gate 324 may provide the logic 0 value to an inverter 338. As such, the inverter 338 may provide a logic 1 value as the activation signal 302. For example, a logic 1 value of the activation signal 302 (e.g., a rising edge of the activation signal 302) may indicate receiving the access commands provided with the first edge and the second edge of the external clock signal.

Moreover, the activation signal 302 may facilitate receiving the remaining address bits of the access command provided using the multi-clock cycle memory command protocol for performing the memory operations in one memory cycle, as will be appreciated. As such, the memory device 100 may use the circuit 300 to efficiently receive additional address bits of the access commands (e.g., each access command) with subsequent edges of the external clock cycle in a memory cycle. In specific cases, based on using the multi-clock cycle memory command protocol, the subsequent edges of the external clock cycle may only include address bits. Such address bits may include information related to a memory bank address, a row address, and/or column address of the targeted memory cells 200.

With the foregoing in mind, the inverter 338 may provide the logic 1 value of the activation signal 302 (INT_ACT1P) to the NOR gate 310 (e.g., in a feedback scheme). In some cases, the circuit 300 may receive a second chip select signal 308. In such cases, the NOR gate 310 may also receive a logic 0 value from the inverter 306. In any case, the NOR gate 310 may provide a logic 0 value to the NAND gate 312 upon receiving the activation signal 302 with the logic 1 value. Accordingly, the NAND gate 312 may provide a logic 1 value to the inverter 314.

In turn, the inverter 314 may provide a logic 0 value to the latching circuit 316. Subsequently, the latching circuit 316 and the AND gate 320 may provide a logic 0 value for the first internal signal 322 to the first input of the NOR gate 324 and the latching circuit 326 of the third portion of the circuit 300C. In some cases, the latching circuit 326 may not receive (e.g., input) additional data bits based on receiving the logic 0 value for the first internal signal 322.

When the access instruction is provided using one clock cycle, the circuit 300 may provide the received address bits to the downstream memory components. For example, the latching circuit 326 may provide the first portion of the address bits 328 and the second portion of the address bits 330 to the downstream memory components. However, when the access instruction is provided using multiple clock cycles (e.g., 2 clock cycles, 3 clock cycles, etc.), the circuit 300 may receive the remaining portion of the address bits based on operations described herein. That said, it should be appreciated that the example embodiment described herein is by the way of example and different circuit schemes may perform similar or different functions for receiving the remaining portion of the address bits.

In any case, the NAND gate 340 may receive the activation signal 302 with a logic 1 value and a reference voltage 342 (e.g., VPERI) with a logic 1 value. For example, an internal or external electric power source may provide the reference voltage 342. Subsequently, the NAND gate 340 may provide a logic 0 value to an inverter 344 in response to receiving the logic 1 inputs of the activation signal 302 and the high reference voltage 342. The inverter 344 may in turn provide a logic 1 output to a latching circuit 346 (e.g., a flip-flop). The latching circuit 346 may also receive the internal memory clock signal 318.

Subsequently, the latching circuit 346 may provide a logic 1 output to an AND gate 348. The AND gate 348 may also receive the internal memory clock signal 318. The AND gate 348 may provide a second internal signal 350 with a logic 1 value. The AND gate 348 may provide the second internal signal 350 to the second input of the NOR gate 334 and a latching circuit 352 of the third portion of the circuit 300A. The latching circuit 352 may receive (e.g., input) a third portion of the address bits 354 (INT_CA_R2<6:0>) and a fourth portion of the address bits 356 (INT_CA_F2<6:0>) based on receiving the second internal signal 350 (INT_ACT2).

For example, the latching circuit 352 may receive the third portion of the address bits 354 at a third edge of the external clock signal and may receive the fourth portion of the address bits 356 at a fourth edge of the external clock signal. Moreover, when the memory device 100 includes 7 pins for communicating data bits, the third portion of the address bits 354 and the fourth portion of the address bits 356 may each include 7 (or up to 7) address bits. Accordingly, the latching circuit 352 may receive 14 address bits with the third and fourth edges of the external clock signal.

As such, the NOR gate 334 may receive the second internal signal 350 and the first signal 332 output from the NOR gate 324 of the first portion of the circuit 300A. As such, the NOR gate 334 may provide a logic 0 value as the second signal 336 to the NOR gate 324. Accordingly, the NOR gate 324 may provide a logic 1 value based on receiving logic 0 values for the first internal signal 322 and the second signal 336. Accordingly, the inverter 338 may provide a logic 0 value for the activation signal 302. In some cases, the first portion of the circuit 300A may become idle in response to the inverter 338 may providing the logic 1 value for the activation signal 302. Moreover, the second portion of the circuit 300B may become idle in response to the inverter 338 may providing the logic 0 value for the activation signal 302.

The AND gate 348 may also provide the second internal signal 350 (INT_ACT2) to a string of inverters 358. The string of inverters 358 may include an even number of inverters. For example, in the depicted embodiment, the string of inverters 358 may include 4 inverters. Such inverters may buffer or delay the second internal signal 350. Accordingly, in different embodiments, different electronic components may be used in place of the string of inverters 358. For example, in some cases, the string of inverters 358 may include a number of buffers.

In any case, the string of inverters 358 may delay the second internal signal 350. Subsequently, the string of inverters 358 may provide a trigger signal 360 (INT_ACT2_2). The string of inverters 358 may provide the trigger signal 360 to a latching circuit 362. The latching circuit 362 may be connected to an output of the latching circuits 326 and 352. The first portion of the address bits 328, the second portion of the address bits 330, the third portion of the address bits 354, and the fourth portion of the address bits 356 may include a bank address 364 and a row address 366. Accordingly, based on receiving the trigger signal 360, the latching circuit 362 may receive the bank address 364 and the row address 366 from the latching circuits 326 and 352.

Accordingly, the latching circuit 362 may provide the bank address 364 and the row address 366 to the downstream memory components based on receiving the trigger signal 360. For example, the latching circuit 362 may provide the bank address 364 and the row address 366 to the control blocks 132 of the memory banks 102, described above with respect to FIG. 1, via the bus path 126.

In different embodiments, the controller 108, the command interface 104, the control blocks 132, the row decoder 206, the column decoder 210, or a combination of the aforementioned memory components (or blocks), among other viable memory components may include the circuit 300. Moreover, it should be appreciated that the circuit 300 is depicted by way of example and in other cases, the memory device 100 may include a different circuit 300 for receiving and decoding the access commands provided using the multi-clock cycle memory command protocol to provide the access instructions to the downstream memory components.

Figure 4:
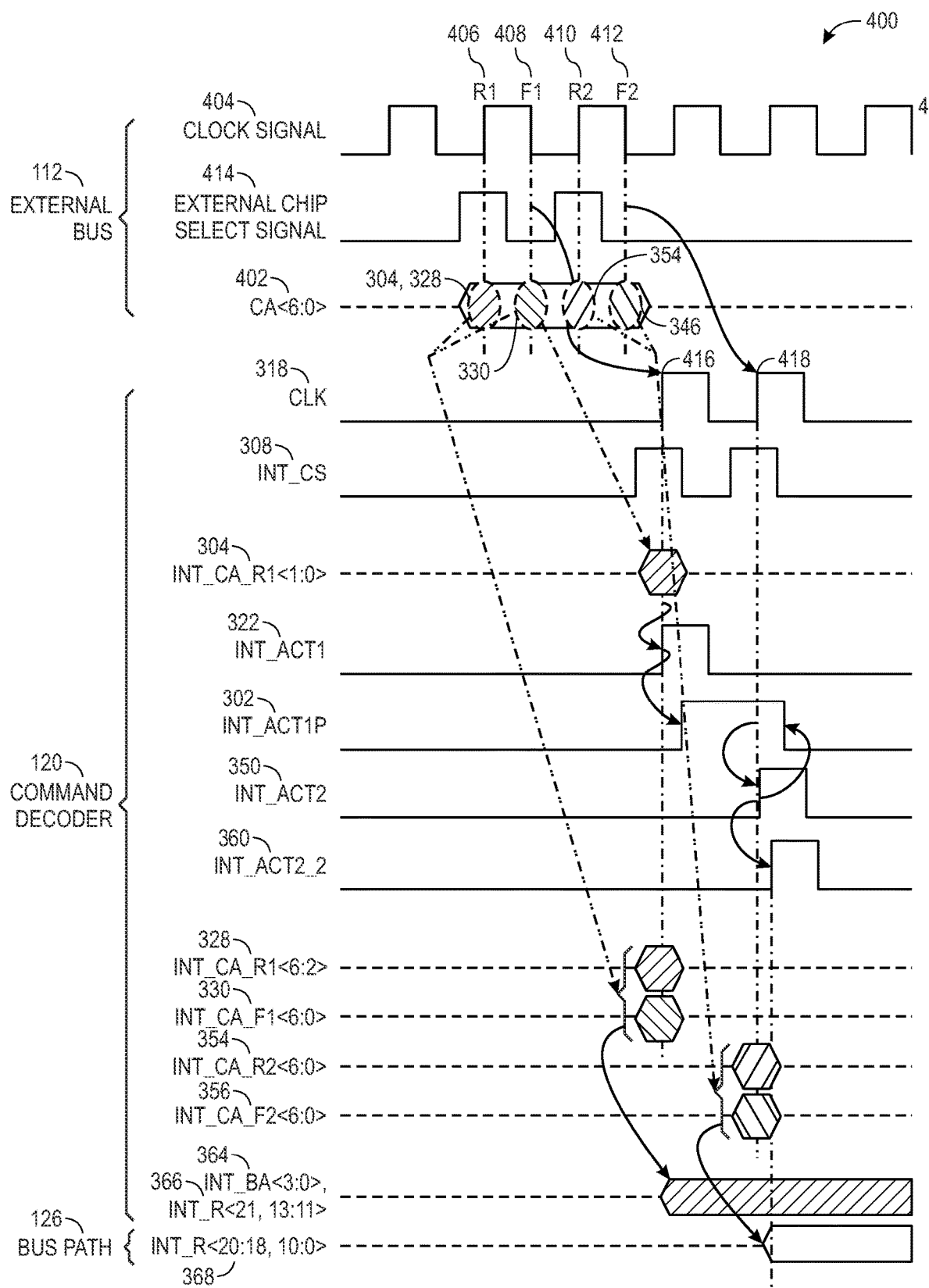
FIG. 4 is a timing diagram depicting example timing of signals for accessing memory cells of the memory device using a multi-clock cycle memory command protocol, in accordance with an embodiment of the present disclosure.

With the foregoing in mind, FIG. 4 is a timing diagram 400 depicting example timing of signals for accessing memory cells 200 of the memory device 100 using the multi-clock cycle memory command protocol and the circuit 300 of the command decoder 120. The timing diagram 400 may include signals received via the external bus 112, signals of the command decoder 120 (e.g., the circuit 300), and signals transmitted via the bus path 126 to access the requested memory cells 200.

As mentioned above, the memory device 100 may receive an access command 402 (CA<6:0>). In some cases, the memory device 100 may receive the access command 402 via a processing component (e.g., a processor). In any case, the memory device 100 may receive the access command 402 provided using the multi-clock cycle memory command protocol. Accordingly, as mentioned above, the access command 402 may include the header 304, the first portion of the address bits 328, the second portion of the address bits 330, the third portion of the address bits 354, and the fourth portion of the address bits 356.

Moreover, in some cases, the memory device 100 may receive the access commands 402 according to edges of an external clock signal 404. In some cases, the memory device 100 may receive the header 304 and the first portion of the address bits 328 with a first rising edge 406 (R1) of the external clock signal 404 and may receive the second portion of the address bits 330 with a first falling edge 408 (F1) of the external clock signal 404. A first high signal of an external chip select signal 414 may indicate receiving the header 304 and the first portion of the address bits 328 with the first rising edge 406 and receiving the second portion of the address bits 330 with the first falling edge 408.

Similarly, the memory device 100 may receive the third portion of the address bits 354 with a second rising edge 410 (R2) of the external clock signal 404 and may receive the fourth portion of the address bits 356 with a second falling edge 412 (F2) of the external clock signal 404. Moreover, a second high signal of the external chip select signal 414 may indicate receiving the third portion of the address bits 354 with the second rising edge 410 and may receive the fourth portion of the address bits 356 with the second falling edge 412. For example, the I/O interface 106 of the memory device 100, described above with respect to FIG. 1, may receive the access command 402. The I/O interface 106 may provide the access commands 402 to the command decoder 120 (or the circuit 300).

Referring now to the signals of the command decoder 120, the command decoder 120 may latch the first portion of the address bits 328 and the second portion of the address bits 330 at a first rising edge 416 of the internal memory clock signal 318 based on the first internal signal 322. As mentioned above and depicted in the timing diagram 400, the command decoder 120 may provide the first internal signal 322 based on receiving a first logic 1 value of the chip select signal 308 and the header 304.

Subsequently, the command decoder 120 may latch the third portion of the address bits 354 and the fourth portion of the address bits 356 at a second rising edge 418 of the internal memory clock signal 318 based on the second internal signal 350. The command decoder 120 may provide the second internal signal 350 based on providing the activation signal 302. As mentioned above, the command decoder 120 may provide the activation signal 302 based on providing the first internal signal 322.

Accordingly, the command decoder 120 may include the bank address 364 and the row address 366. Subsequently, the command decoder 120 may provide the access instructions 368 to the downstream memory components (e.g., the memory banks 102) for performing the requested memory operations based on the trigger signal 360. The access instructions 368 may include the bank address 364 and the row address 366.

In one non-limiting example, the memory banks 102 of the memory device 100 may include 22 rows of memory cells 200. Moreover, the memory device 100 may include 8 memory banks 102 disposed in 2 memory groups. For example, each memory group may include 4 memory banks 102. Furthermore, the memory device 100 may include 7 pins. Accordingly, the memory device 100 may receive 7 data bits at teach edge of the external clock signal 404.

In such example, the access commands 402 may include 26 data bits, including the header 304 and the address bits, corresponding to the 22 rows of the memory banks 102 and the targeted memory banks 102. Accordingly, using the multi-command memory command protocol, the command decoder 120 may efficiently receive and decode the access commands 402 using 26 data bits to identify the target memory cells 200 and perform the requested memory operations. For example, the command decoder 120 may efficiently receive and decode the access commands 402 via 7 pins targeting memory banks 102 with 22 rows based on receiving one header 304 with multiple (e.g., 2) clock cycles of the external clock signal 404 and/or the internal memory clock signal 318 for performing requested memory operations in one memory cycle. Accordingly, the memory device may receive and decode the memory access requests faster and more efficiently using the multi-clock cycle memory command protocol.

Figure 5:
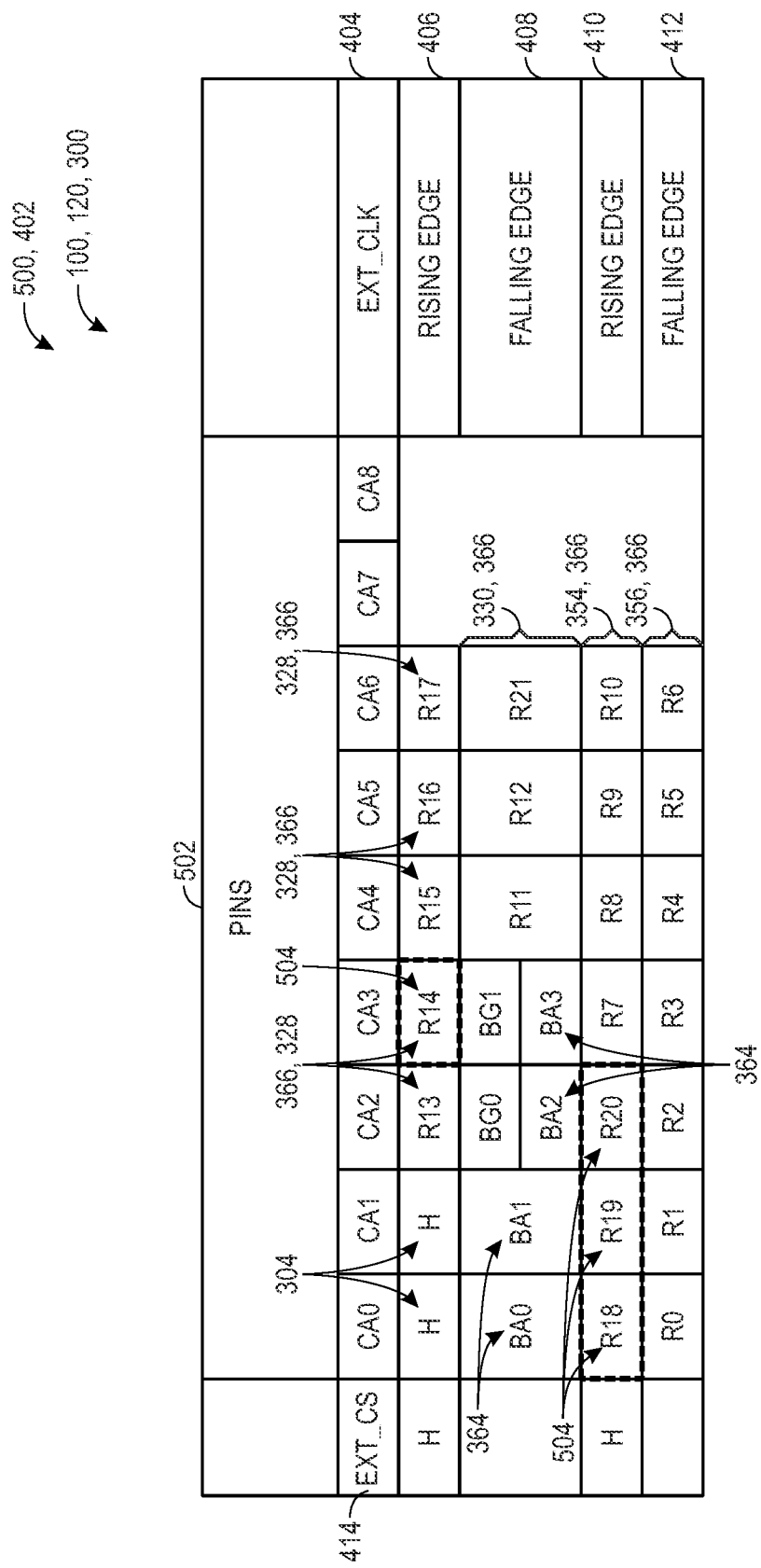
FIG. 5 is a diagram depicting example access commands provided using the multi-clock cycle memory command protocol, in accordance with an embodiment of the present disclosure.

FIG. 5 is a diagram 500 depicting an example access command 402 provided using the multi-clock cycle memory command protocol. The diagram 500 may depict using 7 pins 502 (e.g., CA0, CA1, ... CA6) of the memory device 100 for receiving the access commands 402. In some embodiments, the I/O interface 106 may include the pins 502.

In some embodiments, as described above and depicted in FIG. 5, the command decoder 120 (e.g., the circuit 300) may receive the header 304 (e.g., high signals, H) and the first portion of the address bits 328 of the access command 402 at the first rising edge 406 of the external clock signal 404 when receiving the first logic 1 value of the external chip select signal 414. In the depicted embodiment, the first portion of the address bits 328 may include 5 data bits of the row address 366 (e.g., R13, R14, R15, R16, and R17).

Moreover, the command decoder 120 may receive the second portion of the address bits 330 of the access command 402 at the first falling edge 408. In the depicted embodiment, the second portion of the address bits 330 may include 4 data bits indicative of the bank address 364 (e.g., BA0, BA1, BG0 and BA2, and BG1 and BA3). The second portion of the address bits 330 may also include 3 data bits of the row address 366.

The command decoder 120 may receive the third portion of the address bits 354 of the access command 402 at the second rising edge 410 of the external clock signal 404 when receiving the second logic 1 value of the external chip select signal 414. In the depicted embodiment, the third portion of the address bits 354 may include 7 data bits of the row address 366.

Similarly, the command decoder 120 may receive the fourth portion of the address bits 356 of the access command 402 at the second falling edge 412 of the external clock signal 404 when receiving the second logic 1 value of the external chip select signal 414. In the depicted embodiment, the fourth portion of the address bits 356 may include 7 data bits of the row address 366.

With these technical effects in mind, providing such memory command protocols may allow efficiently performing memory operations when using memory devices including a higher number of rows and/or columns in each memory bank of the memory array with a constant number of communication pins. For example, the controller may efficiently access the memory cells of memory banks with a higher number of rows and/or columns with a lower number of communication pins by providing the commands using a higher number of clock cycles. Moreover, in some cases, a controller may be used on the host-side of a memory-host interface; for example, a processor, microcontroller, field programmable gate array (FPGA), application-specific integrated circuit (ASIC), or the like may each include a memory controller to facilitate performing such operations. Furthermore, a communication network may enable data communication there between and, thus, a client device to utilize hardware resources accessible through the controller.

Based at least in part on user input to the client device, processing circuitry associated with the memory device may perform one or more operations to transmit one or more memory access requests for accessing memory cells arranged in multiple rows of data banks of a memory array. Moreover, the controller may provide the commands using a number of clock cycles based on the number of rows of the memory banks and a number of communication pins of the memory banks to facilitate efficient response to the one or more memory access requests.

Data communicated between the client device and the memory devices may be used for a variety of purposes including, but not limited to, presentation of a visualization to a user through a graphical user interface (GUI) at the client device, processing operations, calculations, or the like. Thus, with this in mind, the above-described improvements to memory, controller operations, and memory operations may manifest as improvements in visualization quality (e.g., speed of rendering, quality of rendering), improvements in processing operations, improvements in calculations, or the like.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
a plurality of memory banks, each memory bank of the plurality of memory banks comprising a plurality of memory cells; and
command decoder circuitry, wherein the command decoder circuitry is configured to receive an access command provided over two clock cycles of an external clock signal to access one or more target memory cells of the plurality of memory cells of the plurality of memory banks, wherein command decoder circuitry comprises:
a first portion comprising circuitry configured to provide a first signal and an activation signal in response to receiving a header of the access command at a first clock cycle of the two clock cycles and a first chip select signal;
a second portion comprising circuitry configured to provide a second signal in response to receiving the activation signal; and
a third portion comprising circuitry configured to:
receive a first portion of address bits of the access command at the first clock cycle of the two clock cycles based on receiving the first signal;
receive a second portion of address bits of the access command at a second clock cycle of the two clock cycles based on receiving the second signal; and
provide the first portion of the address bits and the second portion of the address bits to access the target memory cells based on receiving a trigger signal associated with the second signal.

2. The memory device of claim 1, wherein each clock cycle corresponds to a rising edge and a falling edge of the external clock signal, and wherein the memory device is configured to receive data bits at the rising edge and the falling edge of the external clock signal.

3. The memory device of claim 2, wherein the memory device comprises 7 pins for receiving the access commands, wherein the memory device is configured to receive 1 data bit using each pin at each rising edge or falling edge of the external clock signal.

4. The memory device of claim 3, wherein the command decoder circuitry is configured to:
receive 2 data bits associated with the header and 12 data bits associated with the first portion of the address bits at the first clock cycle; and
receive 14 data bits associated with the second portion of the address bits at the second clock cycle.

5. The memory device of claim 1, wherein the trigger signal is a delayed signal associated with the second signal.

6. The memory device of claim 1, wherein a memory bank of the plurality of memory banks comprises 22 rows of memory cells.

7. The memory device of claim 6, wherein the access command comprises 22 address bits corresponding to the 22 rows of the memory bank.

8. A method, comprising:
receiving, by command decoder circuitry of a memory system, a header and a first portion of address bits of an access command for performing a memory operation at a first clock cycle of an external clock signal;
providing, by the command decoder circuitry, a first signal and an activation signal based on receiving the header;
latching, by latching circuitry of the command decoder circuitry, the first portion of the address bits based on the first signal;
providing, by the command decoder circuitry, a second signal and a trigger signal based on receiving the activation signal;
receiving, by the command decoder circuitry, a second portion of the address bits of the access command at a second clock cycle of the external clock signal;
latching, by the command decoder circuitry, the second portion of the address bits based on the second signal; and providing, by the command decoder circuitry, the first portion and the second portion of the address bits based on the trigger signal to downstream memory components for performing the memory operation.

9. The method of claim 8, wherein the memory device comprises 7 pins.

10. The method of claim 9, wherein the first clock cycle and the second clock cycle each comprise a rising edge and a falling edge of the external clock signal.

11. The method of claim 10, wherein the memory system is configured to receive 7 data bits of the access command at the rising edge and receive 7 data bits of the access command at the falling edge of each of the first clock cycle and the second clock cycle using the 7 pins.

12. The method of claim 8, wherein the access command comprises 28 data bits comprising 2 data bits of the header and 26 address bits.

13. The method of claim 12, wherein the 26 address bits comprise 22 row address bits corresponding to 22 rows of memory cells of a memory bank of the memory device.

14. An apparatus, comprising:
a processor subsystem configured to provide an access command for performing one or more memory operations;
a bus; and
a memory subsystem communicatively coupled to the processor subsystem via the bus, wherein the memory subsystem comprises:
a first portion configured to receive a header of the access command via the bus and provide a first signal in response to receiving the header, wherein the first portion is configured to provide the first signal to:
a first NOR gate of the first portion, wherein the first NOR gate is configured to provide a high activation signal based on receiving the first signal to a second NOR gate of the first portion and to a second portion of the memory subsystem; and
a first latching circuit of a third portion of the memory subsystem, wherein the first latching circuit is configured to receive a first address portion of the access command;
the second portion configured to provide a second signal in response to receiving the high activation signal, wherein the second portion is configured to provide the second signal to:
a first NOR gate of the second portion coupled to the first NOR gate of the first portion, wherein the first NOR gate of the first portion is configured to provide a low activation signal based on the first NOR gate of the second portion receiving the second signal to the second NOR gate of the first portion and to the second portion of the memory subsystem;
a delay circuit, wherein the delay circuit is configured to provide a delayed signal of the second signal to a third latching circuit of the third portion; and
a second latching circuit of the third portion, wherein the second latching circuit is configured to receive a second address portion of the access command; and
the third portion comprising:
the first latching circuit;
the second latching circuit; and
a third latching circuit configured to provide the first address portion of the access command and the second address portion of the access command based on receiving the delayed signal of the second signal from the delay circuit.

15. The apparatus of claim 14, wherein the first signal transitions low based on the second NOR gate of the first portion receiving the first signal.

16. The apparatus of claim 14, wherein the first address portion and the second address portion of the access commands are indicative of one or more target memory cells for performing the one or more memory operations.

17. The apparatus of claim 14, wherein:
the first portion of the memory subsystem is configured to become idle in response to the second NOR gate of the first portion receiving the high activation signal; and
the second portion of the memory subsystem is configured to become idle in response to receiving the low activation signal.

18. The apparatus of claim 14, wherein the access command comprises 26 data bits, and wherein the memory subsystem is configured to receive the access command using a rising edge and a falling edge of a first clock cycle and rising edge and a falling edge of a second clock cycle.

19. The apparatus of claim 14, wherein the delay circuit comprises a number of inverters or buffers.

20. The apparatus of claim 14, wherein the memory subsystem is configured to receive the header and the first address portion of the access command based on a first clock cycle of a clock signal associated with the apparatus and receive the second address portion of the access command based on a second clock cycle of the clock signal.

* * * * *